United States Patent
Juan

(10) Patent No.: US 9,977,058 B2
(45) Date of Patent: May 22, 2018

(54) DEVICE AND METHOD FOR MEASURING THE POWER CONSUMPTION, CONTACTLESS DEVICE AND METHOD FOR MEASURING POWER SUPPLY STATUS

(71) Applicant: EVERSPRING INDUSTRY CO., LTD., New Taipei (TW)

(72) Inventor: Su Mei Juan, Hong Kong (HK)

(73) Assignee: EVERSPRING INDUSTRY CO., LTD., New Taipei (TW)

( * ) Notice: Subject to any disclaimer, the term of this patent is extended or adjusted under 35 U.S.C. 154(b) by 301 days.

(21) Appl. No.: 14/878,057

(22) Filed: Oct. 8, 2015

(65) Prior Publication Data

US 2017/0102417 A1    Apr. 13, 2017

(51) Int. Cl.
*G01R 21/133* (2006.01)
*G01R 21/00* (2006.01)

(52) U.S. Cl.
CPC ....... *G01R 21/1331* (2013.01); *G01R 21/006* (2013.01)

(58) Field of Classification Search
None
See application file for complete search history.

(56) References Cited

U.S. PATENT DOCUMENTS

| | | | | |
|---|---|---|---|---|
| 5,473,244 | A * | 12/1995 | Libove | G01R 1/22 324/126 |
| 2002/0125877 | A1* | 9/2002 | Cooke | G01R 15/18 324/127 |
| 2012/0259565 | A1* | 10/2012 | Oshima | G01R 21/06 702/61 |
| 2013/0229192 | A1* | 9/2013 | Behringer | G01R 11/02 324/658 |

* cited by examiner

*Primary Examiner* — Melissa Koval
*Assistant Examiner* — Nasima Monsur
(74) *Attorney, Agent, or Firm* — Li & Cai Intellectual Property (USA) Office

(57) ABSTRACT

A device and a method used to measuring a real power transmitted by the power line are provided. The device comprises a detecting unit and a calculating unit, for obtaining the power factor and the real power according to a sensing voltage signal and a sensing current signal. The device is characterized by: the detecting unit having an electric field detector and a magnetic field detector, two electrodes of the electric field detector respectively disposed adjacent to the power wires, the sensing voltage signal being the voltage difference between the two electrodes, two coils with metal cores of the magnetic field detector respectively disposed adjacent to the power wires, the winding directions of the two coils being contrary, the two coils being coupled in series based on the same sensing current direction for obtaining the sensing current signal.

13 Claims, 6 Drawing Sheets

DEVICE AND METHOD FOR MEASURING THE POWER CONSUMPTION, CONTACTLESS DEVICE AND METHOD FOR MEASURING POWER SUPPLY STATUS

BACKGROUND OF THE INVENTION

1. Field of the Invention

The instant disclosure relates to a device and a method for measuring the power consumption; in particular, to a device and a method by using sensing the voltages and the currents on the AC power line in a contactless way for measuring the power consumption.

2. Description of Related Art

The conventional household power meter, adapted for accumulation of the used electric power, usually directly measures the current and the voltage by using electric conductors for measuring the electric power consumption. Practically, the power consumption calculation is based on the real power (or active power). The real power indicating the power consumption is related to the power factor. For a resistive load, the power factor is 1. However, for a non-resistive load, such as an inductive load or a capacitive load, the power factor is not 1 when feeding electric power into the non-resistive load. Conductive-type measurement can obtain the actual current, the actual voltage and the power factor. However, the conductive-type measurement is a contact-type measurement which introduces conduction loss during measurement. And, this measurement has the potential risk of electric shock. Therefore, the design of the contact-type measurement is more complicated and the installation could be cumbersome.

Additionally, the current clamp meter can contactlessly measure the current on the power line. Compared to the contact-type measurement, the current clamp meter has the feature of easy to use and avoiding the danger of the electrical leakage in contact. However, the current clamp utilizing contactless measurement can only measure the real-time current, but the real-time voltage cannot be obtained at the same time, thus the power factor cannot be obtained. Because the power factor cannot be obtained, the real power is not possible to be obtained. In other words, for the circumstance of the power is not equal to 1, the current clamp meter utilizing contactless measurement cannot obtain the real power.

SUMMARY OF THE INVENTION

The object of the instant disclosure is to provide a device and a method for measuring the power consumption, and a contactless device and a method for measuring power supply status. The devices and the method obtain the voltage of the power wire by measuring the electric field of the power wire, and obtain the current of the power by measuring the magnetic field of the power, for obtaining the power factor of the AC power, so as to obtain the real power.

In order to achieve the aforementioned objects, according to an embodiment of the instant disclosure, a device for measuring the power consumption is provided. The device is used for measuring a real power transmitted by the power line. The power line comprises a first power wire and a second power wire. The device for measuring the power consumption comprises a detecting unit and a calculating unit. The calculating unit is electrically coupling to the detecting unit. The calculating unit obtains a power factor according to a sensing voltage signal and a sensing current signal generated by the detecting unit. The calculating unit obtains the real power according to the sensing voltage signal, the sensing current signal and the power factor. The device for measuring the power consumption is characterized by: the detecting unit having an electric field detector and a magnetic field detector, used for being disposed adjacent to the first power wire and the second power wire, wherein the electric field detector has a first electrode and a second electrode, the magnetic field detector has a first coil and a second coil; wherein the first electrode and the second electrode are respectively disposed adjacent to the first power wire and the second power wire, the first electrode and the first power wire create a first voltage level at the first electrode according to capacitive effect, the second electrode and the second power wire create a second voltage level at the second electrode according to capacitive effect, the sensing voltage signal is the potential difference between the first voltage level and the second voltage level; wherein the first coil and the second coil are respectively disposed adjacent to the first power wire and the second power wire, winding direction of the first coil is contrary to winding direction of the second coil, the first coil and the second coil are coupled in series based on the same sensing current direction for obtaining the sensing current signal corresponding to the currents on the first power wire and the second power wire.

In order to achieve the aforementioned objects, according to an embodiment of the instant disclosure, a method for measuring the power consumption is provided. The method measures a real power transmitted by a first power wire and a second power wire of the power line. The method is characterized by: disposing a first electrode and a second electrode adjacent to the first power wire and the second power wire respectively, disposing a first coil and a second coil adjacent to the first power wire and the second power wire respectively, wherein winding direction of the first coil is contrary to winding direction of the second coil; obtaining the voltage difference between the voltage level of the first electrode and the voltage level of the second electrode to generate a sensing voltage signal; coupling the first coil and the second coil in series based on the same sensing current direction for obtaining a sensing current signal corresponding to the currents on the first power wire and the second power wire; and obtaining a power factor according to the phase difference between the sensing voltage signal and the sensing current signal, utilizing a calculating unit to calculate the real power according to the sensing voltage signal, the sensing current signal and the power factor.

In order to achieve the aforementioned objects, according to an embodiment of the instant disclosure, a contactless device for measuring power supply status is provided. The contactless device for measuring power supply status measures the sensing voltage signal and the sensing current signal of the power line at the same time. The power line comprises a first power wire and a second power wire. The contactless device for measuring power supply status is characterized by: the contactless device for measuring power supply status disposed at a contactless position from the power line with a specific distance, the contactless device for measuring power supply status having an electric field detector and a magnetic field detector; the electric field detector having a first electrode and a second electrode, the first electrode and the second electrode respectively disposed adjacent to the first power wire and the second power wire at the specific distance, the first electrode and the first power wire creating a first voltage level at the first electrode according to capacitive effect, the second electrode and the second power creating a second voltage level at the second electrode according to capacitive effect, the voltage difference between the first voltage level and the second voltage level being the sensing voltage signal; wherein the magnetic field detector has a first coil and a second coil, the first coil and the second coil are respectively disposed adjacent to the first power wire and the second power wire at the specific distance, winding direction of the first coil is contrary to winding direction of the second coil, the first coil and the second coil are coupled in series based on the same sensing current direction for obtaining the sensing current signal corresponding to the currents on the first power wire and the second power wire.

In order to achieve the aforementioned objects, according to an embodiment of the instant disclosure, a contactless device for measuring supply current is provided. The contactless device for measuring supply current measures the current transmitted by a power line. The power line comprises a first power wire and a second power wire. The contactless device for measuring supply current has a detecting unit. The contactless device for measuring supply current being characterized by: the detecting unit having a magnetic field detector, wherein the magnetic field detector has a first coil and a second coil; the first coil and the second coil are respectively disposed adjacent to the first power wire and the second power wire, winding direction of the first coil is contrary to winding direction of the second coil, the first coil and the second coil are coupled in series based on the same sensing current direction for obtaining a sensing current signal corresponding to the currents on the first power wire and the second power wire.

In summary, a device and a method for measuring the power consumption, and a contactless device for measuring power supply status are provided in the instant disclosure. The device and the method utilize two electrodes to sense the voltage variation on the power wires according to capacitive effect, and utilize two coils to sense the current variation on the power wires. After obtaining the current variation and the voltage variation of the power wires, comparing the phase difference between the current variation and the voltage variation to obtain the power factor, therefore the real power can be obtained. Based on the contactless measurement, the device and method would not have the conduction loss introduced by conduct-type measurement. And, complicated and dangerous construction procedure of conduct-type measurement can be avoided. Also, potential risk of electric shock when utilizing conduct-type measurement would be avoided.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of a Device for Measuring the Power Consumption and a Contactless Device for Measuring Power Supply Status]

Figure 1:
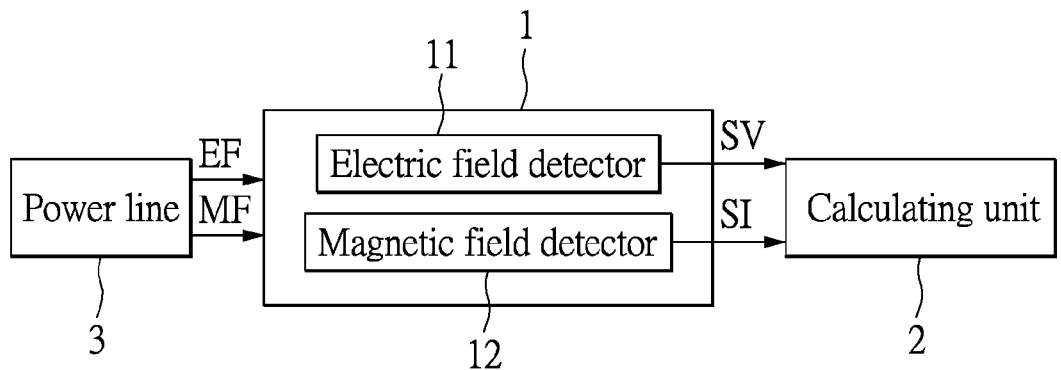
FIG. 1 shows a block diagram of a device for measuring the power consumption according to an embodiment of the instant disclosure.

Please refer to FIG. 1 showing a block diagram of a device for measuring the power consumption according to an embodiment of the instant disclosure. The device for measuring the power consumption is used to measure the real power transmitted by the power line 3 in a contactless way. The power line 3 at least comprises a first power wire and a second power wire. In this embodiment, the first power wire and the second power wire are respectively a firewire (L) and a neutral wire (N) in single-phase two-wire 110 V power supply specifications, but the instant disclosure is not so restricted.

The device for measuring the power consumption comprises a detecting unit 1 and a calculating unit 2. The calculating unit 2 obtains a power factor (PF) according to a sensing voltage signal SV and a sensing current signal SI generated by the detecting unit 2. The calculating unit 2 obtains the real power according to the sensing voltage signal SV, the sensing current signal SI and the power factor (PF). The device for measuring the power consumption is characterized in that the detecting unit 1 has an electric field detector 11 and a magnetic field detector 12, used for being disposed adjacent to the firewire and the neutral wire. The electric field detector 11 detects the electric field EF of the power line in contactless way, and generates the sensing voltage signal SV according to the electric field EF, and then transmits the sensing voltage signal SV to the calculating unit 2. The magnetic field detector 12 detects the magnetic field MF of the power line in contactless way, and generates the sensing current signal SI according to the magnetic field MF, and then transmits the sensing current signal SI to the calculating unit 2. The calculating unit 2 provides functions of calculating the sensing voltage signal SV and the sensing current signal SI, and storing the corresponding parameters or the look-up table (LUT). The calculating unit 2 can be a micro control unit (MCU), but the instant disclosure is not so restricted. In one embodiment, the calculating unit can convert the analog sensing voltage signal SV and the analog sensing current signal SI generated by the detecting unit 1 to digital signals to conduct digital calculations and record the calculation results, but the instant disclosures is not restricted thereto. Regarding to the electric field detector 11 and the magnetic field detector 12, please refer to the descriptions about FIG. 2 and FIG. 3 described hereinafter.

Figure 2:
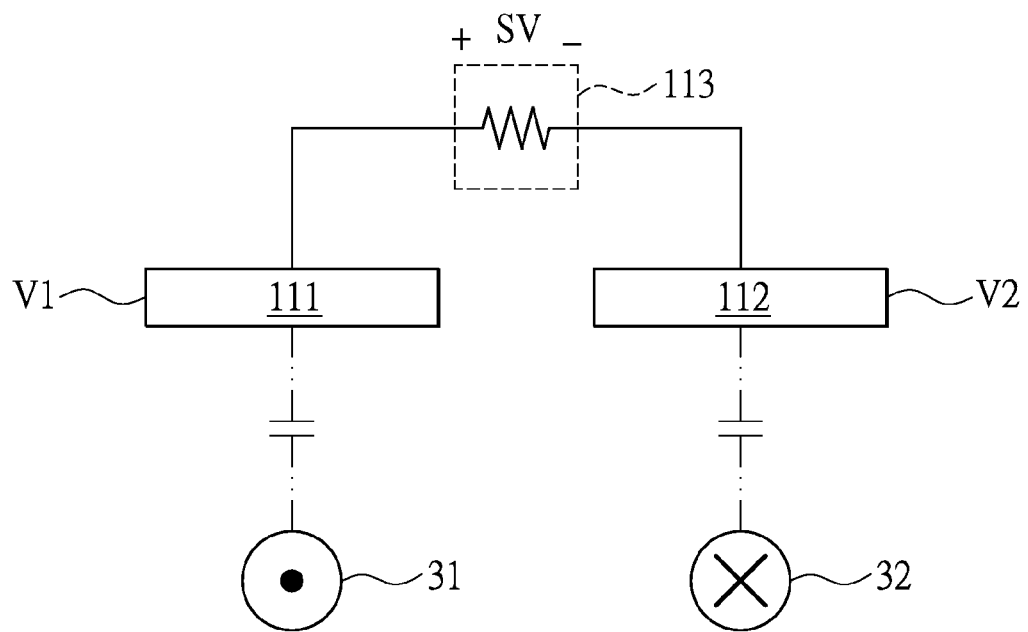
FIG. 2 shows a schematic diagram of measuring the electric field of the power line by a device for measuring the power consumption according to an embodiment of the instant disclosure.

Please refer to FIG. 2 showing a schematic diagram of measuring the electric field of the power line by a device for measuring the power consumption according to an embodiment of the instant disclosure. In FIG. 2, the power line is illustrated by the cross-section view of a first power wire 31 and a second power wire 32. The electric field detector has a first electrode 111 and a second electrode 112. The first electrode 111 and the first power wire 31 (the firewire for example) create a first voltage level V1 at the first electrode 111 according to capacitive effect. The second electrode 112 and the second power wire 32 (the neutral wire for example) create a second voltage level V2 at the second electrode 112 according to capacitive effect. The sensing voltage signal SV shown in FIG. 2 represents the voltage difference (V1−V2) between the first voltage level V1 and the second voltage level V2. The voltage signal providing unit 113 obtains the voltage difference (V1−V2) between the first voltage level V1 and the second voltage level V2 to generate the sensing voltage signal SV. The voltage signal providing unit 113 at least comprises a voltmeter, for example. In practical applications, in order to provide the sensing voltage signal SV to the calculating unit 2 of FIG. 1, the voltage signal providing unit 113 can further convert the sensing voltage signal SV to a signal adapted to be received by the calculating unit 2. However, the instant disclosure does not limit the implementation of the sensing voltage signal SV.

Then, in this embodiment, the first power wire 31 can be the neutral wire (N), and the second power wire 32 can be the firewire (L) correspondingly. It does not matter which one of the first power wire 31 and the second power 31 is the firewire (L) or the neutral wire (N), for the operation of the electric field detector. That is, the relation of the first electrode 111 and the second electrode 112 corresponding to the two power wires can be changes, and it only changes the polarity (such as the polarities + and − shown in FIG. 2) of the voltage difference detected by the voltage signal providing unit 113. However, based on the principle of the AC power, it can be seen the voltage difference (V1−V2) between the first power wire 31 and the second power wire 32 changes periodically, and the polarity of the voltage difference (V1−V2) changes alternatively. Therefore, in practical applications, the polarity of the voltage difference (V1−V2) is changed alternatively and periodically by time. In general, the voltage of the power wire is a function of time, such as Vm*sin($\omega$t+$\theta$1), Vm is the maximum of the voltage, $\omega$ is the frequency of the AC power, $\theta$1 is the voltage phase, t is time. The first voltage level V1 and the second voltage V2 corresponds to the voltage levels on the first power wire 31 and the second power wire 32 established by the voltage Vm*sin($\omega$t+$\theta$1) of the AC power. Therefore, the phase of the voltage difference (V1−V2) should correspond to the voltage phase $\theta$1.

Figure 3:
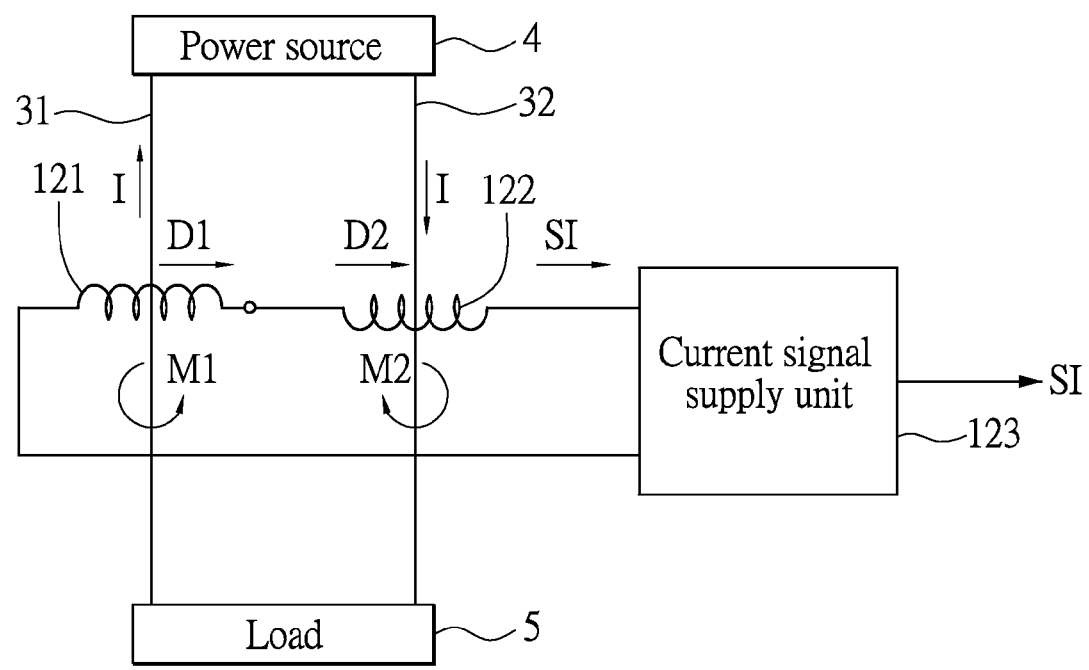
FIG. 3 shows a circuit diagram of measuring the magnetic field of the power line by a device for measuring the power consumption according to an embodiment of the instant disclosure.

Then, please refer to FIG. 3 showing a circuit diagram of measuring the magnetic field of the power line by a device for measuring the power consumption according to an embodiment of the instant disclosure. The power source 4 utilizes the first power wire 31 and the second power wire 32 to transmit electric power to the load 5. The magnetic field detector has a first coil 121 and a second coil 122. The first coil 121 and the second coil 122 are respectively disposed adjacent to the first power wire 31 (the firewire (L), for example) and the second power wire 32 (the neutral wire (N), for example). Winding direction of the first coil 121 is contrary to winding direction of the second coil 122. The first coil 121 and the second coil 122 are coupled in series based on the same sensing current direction for obtaining the sensing current signal SI corresponding to the currents on the firewire and the neutral wire. In this embodiment, the sensing current signal SI in FIG. 3 is the induction current of the first coil 121 and the second coil 122 induced by the variation of the magnetic field of the power wires 31, 32.

Specifically, in the embodiment of FIG. 3, if the first coil 121 winds in clockwise, then the second coil 122 winds in counter-clockwise. As such, the induction current of the first coil 121 and the induction current of the second coil 122 would be opposite under circumstance of the same magnetic field direction. The first coil 121 senses a first magnetic field M1 generated by the current on the first power wire 31 to obtain a first sensing current direction D1. The second coil 122 senses a second magnetic field M2 generated by the current on the second power wire 32 to obtain a second sensing current direction D2, wherein the direction of the first magnetic field M1 is opposite to the direction of the second magnetic field M2, the first sensing current direction D1 is the same as the second sensing current direction D2. Briefly, the first sensing current direction D1 and the second sensing current direction D2 are the same based on the opposite directions of the current I on the first power wire 21 and the current I on the second power wire 22. That is, by using the manner of coupling the first coil 121 and the second coil 122 in series based on the same sensing current direction, the sensing current signal SI corresponding to the current I on the firewire and the current I on the neutral wire can be obtained.

Additionally, in FIG. 3, excepting the first coil 121 and the second coil 122, the magnetic field detector further comprises a current signal supply unit 123. The current signal supply unit 123 generates the sensing current signal SI according to the currents on the first coil 121 and the second coil 122. The current signal supply unit 123 can be a current meter for example. The current signal supply unit 123 is used to convert the sensing current signal SI to a signal adapted to be received by the calculating unit 2 shown in FIG. 1. However, this instant disclosure does not limit the implementations of the current signal supply unit 123.

Furthermore, when considering the phase of the sensing current signal SI, the phase of the induction currents of the first coil 121 and the second coil 122 should correspond to the phase of the current I on the first power wire 31 and the second power wire 32 (wherein the hysteresis is ignored). For example, the current I is represented as Im*sin($\omega$+$\theta$2), Im is the maximum of the current, $\omega$ is the frequency of the AC power, $\theta$2 is the phase of the current, t is time. Therefore, the phase of the induction currents on the first coil 121 and the second coil 122 should correspond to the phase $\theta$2 of the current I.

Furthermore, because winding direction of the first coil 121 is contrary to winding direction of the second coil 122, such that the induction current of the first coil 121 and the induction current of the second coil 122 are opposite to be cancelled under the same magnetic environment. For example, when the geomagnetic field or exterior magnetic interference exists, the first coil 121 and the second coil 122 coupled in series in this way can resist the affection or interference caused by the environment or exterior magnetic field. Therefore, the design for the first coil 121 and the second coil 122 in this embodiment can obtain more accurate measurement results.

Then, regarding to the power factor, when the load 5 is not a resistive load, the voltage phase θ1 would be different from the current phase θ2. Accordingly, when the phase of the sensing voltage signal SV and the phase of the sensing current signal SI are obtained, the phase difference between the voltage and the current of the power line could be obtained, so as to obtain the power factor. In short, the cosine (Cos(θ1−θ2)) of the phase difference (which is the difference between the phase θ1 and the phase θ2) between the sensing voltage signal SV and the sensing current signal SI is the power factor (PF), the real power corresponds to the product of the sensing voltage signal SV, the sensing current signal SI and the power factor (PF). Although the sensing voltage signal SV and the sensing current signal SI are sensed signals, the absolute value of the sensing voltage signal SV and the absolute value of the sensing current signal SI are respectively different from absolute value of the voltage signal and the absolute value of the current signal on the power line, the ratio of the actual value of the real power to the product of the sensing voltage signal, the sensing current signal and the power factor is just a constant of proportionality. Accordingly, the actual value of the real power can be easily obtained through correction procedure only. At most a correction procedure is required before using the device for measuring the power consumption. Furthermore, the power consumption can be correctly measured as long as the relative position between the device for measuring the power consumption and the power line 3 (comprising the first power wire 31 and the second power wire 32) is not changed.

In practical applications, the calculating unit 2 can compare the sensing voltage signal SV and the sensing current signal SI to a look-up table (LUT) for calibrating the real power. In the correction procedure, utilizing the aforementioned manner to locate the device for measuring the power consumption adjacent to the power line at first, then cooperating with a standard contact-type power consumption measurement equipment to measuring the real power. Then, comparing the value of the obtained real power measured by the device for measuring the power consumption to the real power obtained by the standard contact-type power consumption measurement equipment, in order to obtain the correction parameters such as the constant of proportionality. The correction procedure can be made under a variety of circumstances of different powers, so as to establish the look-up table. Therefore, the device for measuring the power consumption can use the predetermined look-up table to cooperate with simple calculations to obtain the accurate value of the real power in normal operation.

Figure 4:
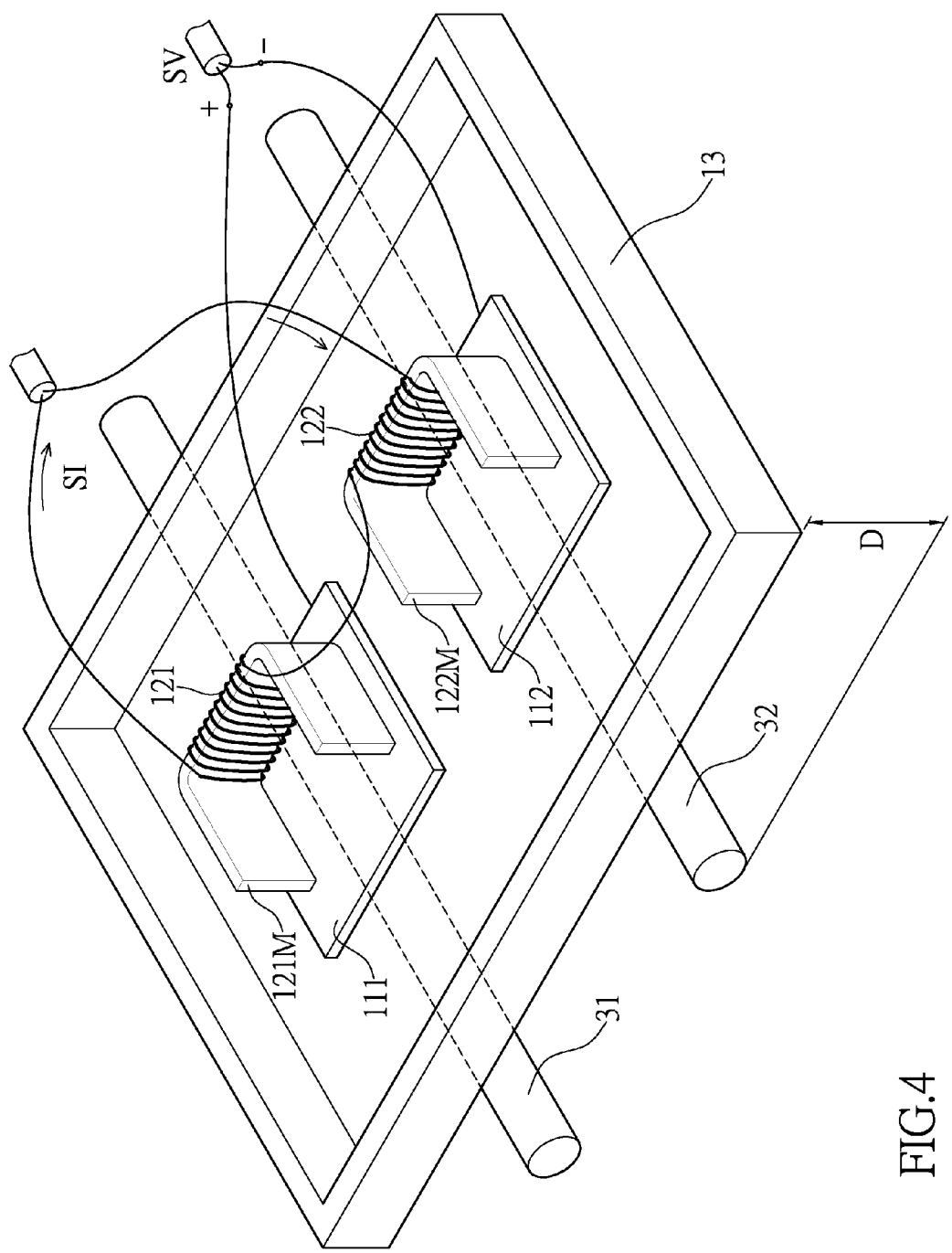
FIG. 4 shows a schematic diagram of measuring the power consumption of the power line by a device for measuring the power consumption according to an embodiment of the instant disclosure.

Then, please refer to FIG. 4 showing a schematic diagram of measuring the power consumption of the power line by a device for measuring the power consumption according to an embodiment of the instant disclosure. The first electrode 111 and the second electrode 112 are respectively disposed at the positions above and adjacent to the first power wire 31 and the second power wire 32 of the two-wire power line 3. The first coil 121 and the second coil 122 are respectively disposed at the positions above and adjacent to the first power wire 31 and the second power wire 32.

Practically, for ease of use, the electric field detector 11 (comprising the first electrode 111 and the second electrode 112) and the magnetic field detector 12 (comprising the first coil 121 and the second coil 122) are integrated to one module 13. Therefore, it only needs to locate the module 13 comprising the first electrode 111, the second electrode 112, the first coil 121 and the second coil 122 at the position adjacent to the first power wire 31 and the second power wire 32, then conducting the measurement and correction procedure. Thus, the accurate power consumption calculation can be achieved accordingly.

In FIG. 4, the first electrode 111 is disposed between the first power wire 31 and the first coil 121, but the instant disclosure is not so restricted. The second electrode 112 is disposed between the second power wire 32 and the second power coil 122, but the instant disclosure is not restricted thereto. Basically, the relative positions between the two electrodes (first electrode 111 and the second electrode 112) and the two coils (first coil 121 and the second coil 122) do not affect the detection result. Because the first electrode 111 and the second electrode 112 are about electric field detection which is affected by the varied voltages (or potentials) on the first power wire 31 and the second power 32 of the power line 3. The first coil 121 and the second coil 122 are about magnetic field detection which is affected by the currents on the first power wire 31 and the second power wire 32 of the power line 3. It is worth mentioning that winding direction of the first coil 121 is contrary to winding direction of the second coil 122. The first coil 121 and the second coil 122 are coupled in series based on the same sensing current direction for obtaining the sensing current signal SI corresponding to the currents on the firewire and the neutral wire.

Based on the descriptions for FIG. 2, FIG. 3 and FIG. 4, the electric field detector 11 and the magnetic field detector 12 of the detecting unit 1 are disposed at a contactless position from the power line 3 with a specific distance D. For example, the specific distance D is the shortest distance between the measured power line and the detecting unit 1, and the specific distance D is larger than 15 mm.

In FIG. 4, the magnetic field detector 12 further comprises a first magnetic element 121M and a second magnetic element 122M. The first coil 121 winds on the first magnetic element 121M. The second coil 122 winds on the second magnetic element 122M. The mentioned magnetic element is usually the silicon steel, iron oxide, or the magnet, which is usually called the iron core, used for assisting the coil to concentrate magnetic field lines. An artisan of ordinary skill in the art will appreciate the implementation manner of the magnetic element, thus there is no need to go into details.

[An Embodiment of a Method for Measuring the Power Consumption]

Figure 5:
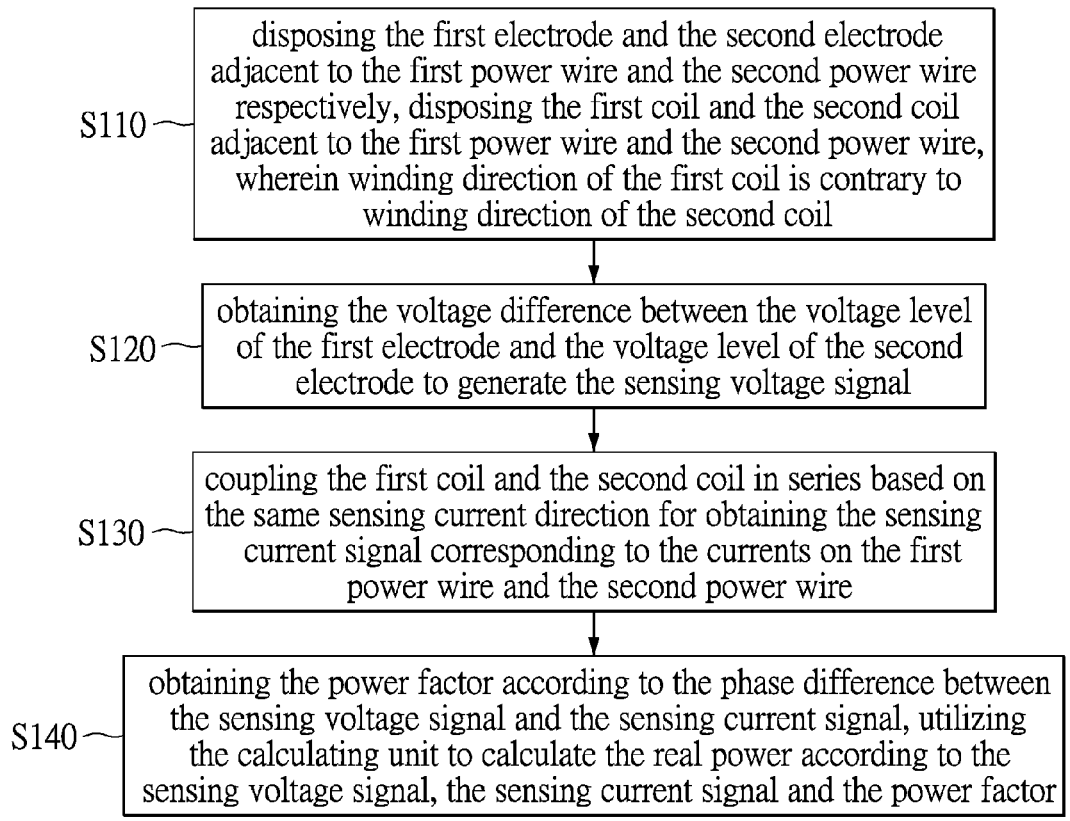
FIG. 5 shows a flow chart of a method for measuring the power consumption according to an embodiment of the instant disclosure.

Please refer to FIG. 5 showing a flow chart of a method for measuring the power consumption according to an embodiment of the instant disclosure. The method measures a real power transmitted by a first power wire and a second power wire of the power line, which can be applied to the device for measuring the power consumption in the previous embodiment. The method comprises following steps. Firstly, in step S110, disposing a first electrode (111) and a second electrode (112) adjacent to the first power wire and the second power wire respectively, disposing a first coil (121) and a second coil (122) adjacent to the first power wire and the second power wire respectively, wherein winding direction of the first coil (121) is contrary to winding direction of the second coil (122). In one embodiment, referring to the aforementioned FIG. 3, corresponding to the step S110, the first coil (121) senses a first magnetic field (M1) generated by the current on the first power wire to obtain a first sensing current direction (D1). The second coil (122) senses a second magnetic field (M2) generated by the current on the second power wire to obtain a second sensing current direction (D2), wherein the direction of the first magnetic field (M1) is opposite to the direction of the second magnetic field (M2), and the first sensing current direction (D1) is the same as the second sensing current direction (D2). Also, in practical, the step S110 can further comprises making the first coil (121) wind on the first magnetic element (121M), and making the second coil (122) wind on the second magnetic element (122M), referring to FIG. 4 described in the previous embodiment.

Then, in step S120, obtaining the voltage difference between the voltage level of the first electrode (111) and the voltage level of the second electrode (112) to generate a sensing voltage signal (SV). Then, in step S130, coupling the first coil (121) and the second coil (122) in series based on the same sensing current direction for obtaining a sensing current signal (SI) corresponding to the currents on the first power wire and the second power wire.

Then, in step S140, obtaining a power factor (PF) according to the phase difference between the sensing voltage signal (SV) and the sensing current signal (SI), and utilizing a calculating unit (2) to calculate the real power according to the sensing voltage signal (SV), the sensing current signal (SI) and the power factor (PF). In the step of obtaining the real power (S140), the cosine of the phase difference between the sensing voltage signal (SV) and the sensing current signal (SI) is the power factor (PF), and the calculating unit (2) multiplying the sensing voltage signal (SV), the sensing current signal (SI) and the power factor (PF) to obtain the real power. Additionally, for the first use after installing the device for measuring the power consumption, a step in the following can be added after step S140: the calculating unit (2) comparing the sensing voltage signal (SV) and the sensing current signal (SI) to a look-up table (LUT) for calibrating the real power.

[Another Embodiment of a Device for Measuring the Power Consumption and a Contactless Device for Measuring Power Supply Status]

Figure 6:
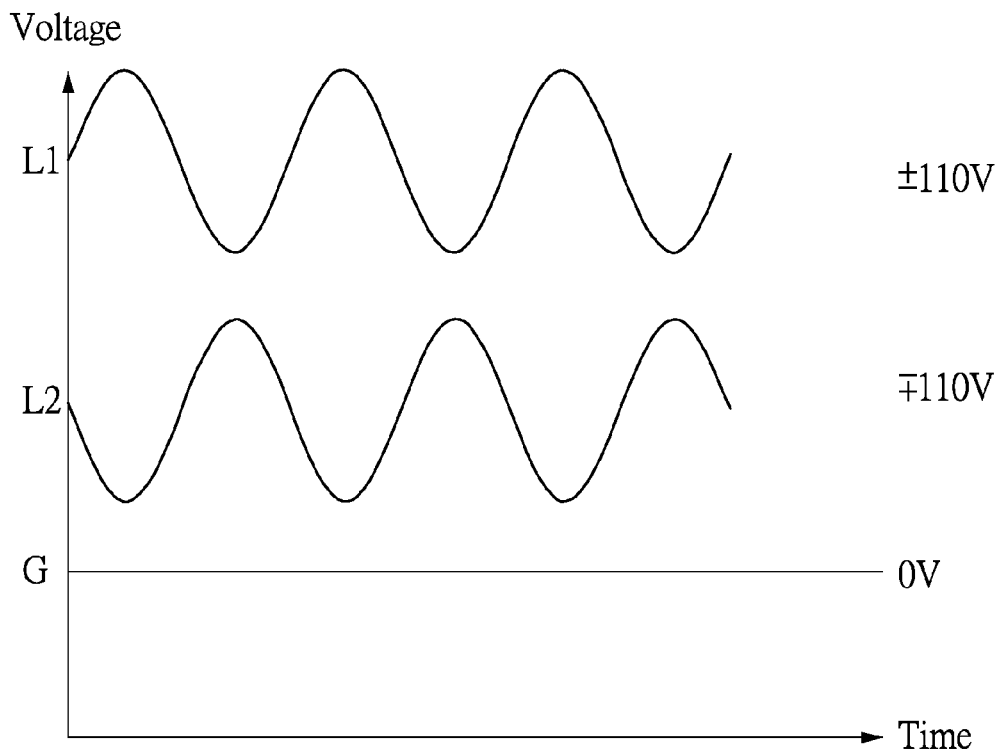
FIG. 6 shows a waveform diagram of the voltage of the conventional single-phase three-wire power line.
Figure 7:
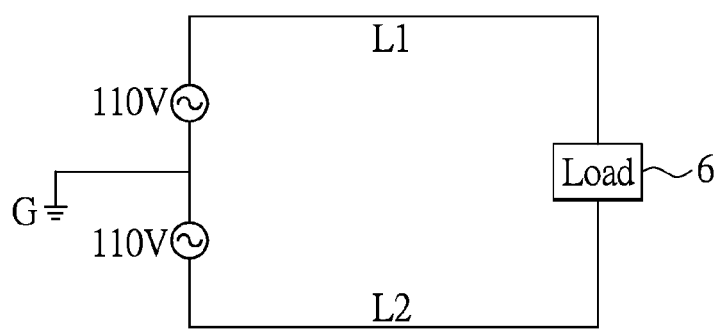
FIG. 7 shows a schematic diagram of providing power to a load utilizing single-phase three-wire power line according to another embodiment of the instant disclosure.

Please refer to FIG. 1 again. The power line 3 is changed to comply with the single-phase three-wire 220V power supply specifications in this embodiment. The power line 3 comprises a first power wire, a second power wire and a ground wire (G). The first power wire and the second power wire are respectively a first firewire (L1) and a second firewire (L2) for the single-phase three-wire 220V power supply specifications. Please refer to FIG. 6, the single-phase three-wire 220V power line provides two firewires and the phase difference between the two firewires are 180 degrees. It can be considered that one single-phase two-wire circuit provides a current input phenomenon and another single-phase two-wire circuit provides a current output phenomenon. The practical circuit connecting the load is shown in FIG. 7.

Figure 8:
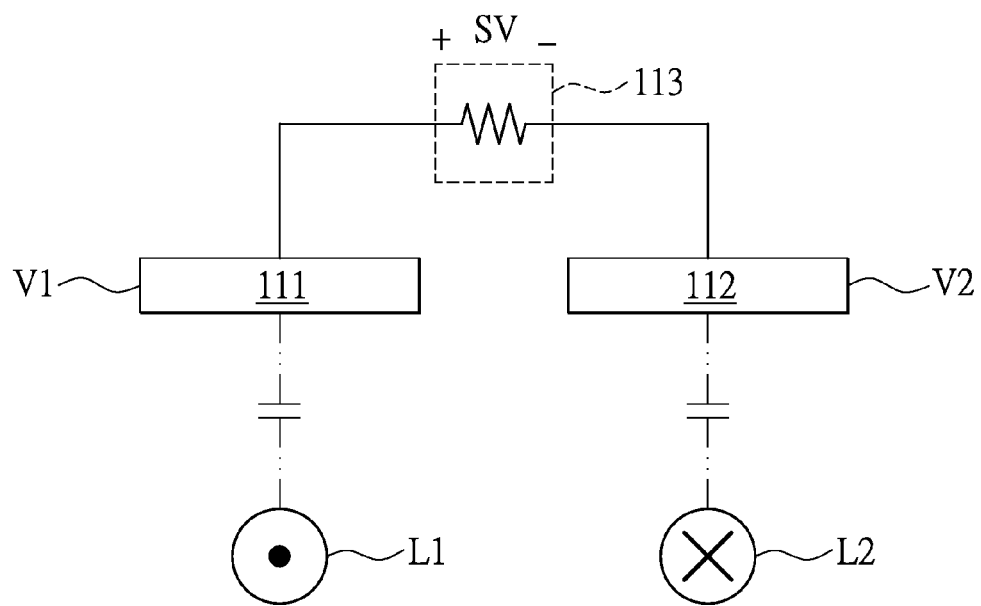
FIG. 8 shows a schematic diagram of measuring the electric field of the power line by a device for measuring the power consumption according to another embodiment of the instant disclosure.

Then, please refer to FIG. 8, in analogy to the embodiment of FIG. 2, the first electrode 111 of the electric field detector 11 and the first power wire (the first firewire L1) create a first voltage level V1 at the first electrode 111 according to capacitive effect. The second electrode 112 and the second power wire (the second firewire L2) create a second voltage level V2 at the second electrode 112 according to capacitive effect. The sensing voltage signal SV in FIG. 8 is the potential difference (V1−V2) between the first voltage level V1 and the second voltage level V2.

Figure 9:
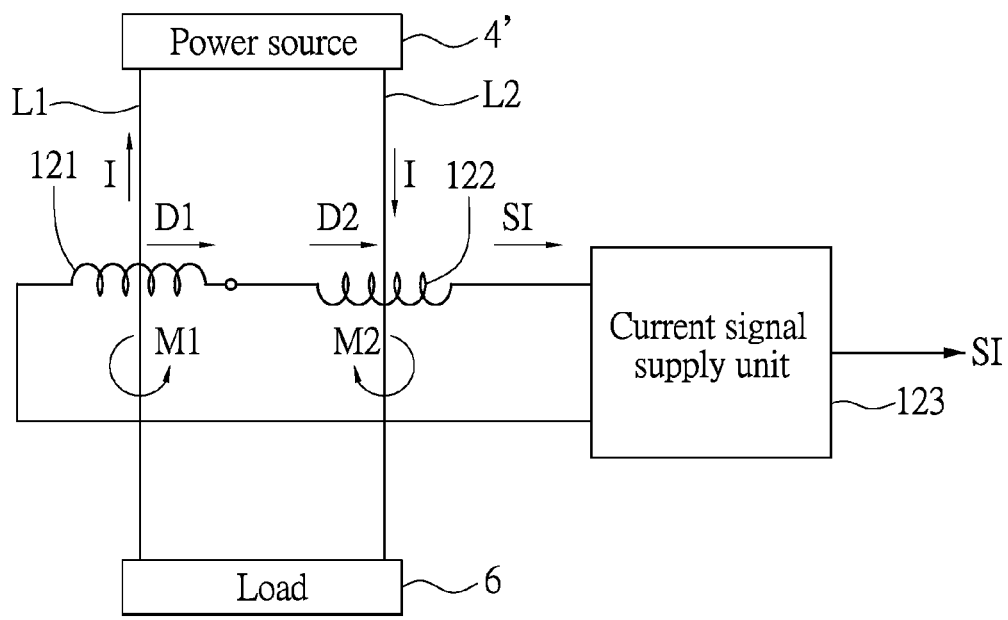
FIG. 9 shows a circuit diagram of measuring the magnetic field of the power line by a device for measuring the power consumption according to another embodiment of the instant disclosure.

Then, please refer to FIG. 9, in analogy to the embodiment of FIG. 3, the power source 4' use first power wire (first firewire L1) and the second power wire (second firewire L2) to transmit electric power to the load 6. The magnetic detector 12 has a first coil 121 and a second coil 122. The first coil 121 and the second coil 122 are respectively disposed adjacent to the first power wire (the first firewire L1) and the second power wire (the second firewire L2). Winding direction of the first coil 121 is contrary to winding direction of the second coil 122. The first coil 121 and the second coil 122 are coupled in series based on the same sensing current direction for obtaining the sensing current signal SI corresponding to the currents on the first firewire L1 and the second firewire L2.

Then, the calculating unit 2 in FIG. 1 can convert the analog sensing voltage signal SV and the analog sensing current signal SI generated by the detecting unit 1 to digital signals to conduct digital calculations and record the calculation results. The contents of the sensing voltage signal SV and the sensing current signal SI, and the related calculations and process can be referred to the aforementioned embodiments, thus there is no need to go into details.

According to above descriptions, the provided device and method for measuring the power consumption, and the contactless device for measuring power supply status utilize two electrodes to sense the voltage variation on the power wires according to capacitive effect, and utilize two coils to sense the current variation on the power wires. After obtaining the current variation and the voltage variation of the power wires, the real power can be obtained. The detection unit of the device can be modularized to be disposed adjacent to the power line which is required to be measured. Based on the contactless measurement, the device and method would not have the conduction loss introduced by conduct-type measurement. And, potential risk of electric shock when utilizing conduct-type measurement can be avoided.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A device for measuring a power consumption, measuring a real power transmitted by a power line, the power line comprising a first power wire and a second power wire, the device for measuring the power consumption comprising a detecting unit and a calculating unit, the calculating unit electrically coupling to the detecting unit, the calculating unit obtaining a power factor according to a sensing voltage signal and a sensing current signal generated by the detecting unit, the calculating unit obtaining the real power according to the sensing voltage signal, the sensing current signal and the power factor, the device for measuring the power consumption being characterized by:

the detecting unit having an electric field detector and a magnetic field detector, used for being disposed adjacent to the first power wire and the second power wire, wherein the electric field detector has a first electrode and a second electrode, the magnetic field detector has a first coil and a second coil;

wherein the first electrode and the second electrode are respectively disposed adjacent to the first power wire and the second power wire, the first electrode and the first power wire create a first voltage level at the first electrode according to capacitive effect, the second electrode and the second power wire create a second voltage level at the second electrode according to capacitive effect, the sensing voltage signal is the potential difference between the first voltage level and the second voltage level;

wherein the first coil and the second coil are respectively disposed adjacent to the first power wire and the second power wire, winding direction of the first coil is contrary to winding direction of the second coil, the first coil and the second coil are coupled in series based on the same sensing current direction for obtaining the sensing current signal corresponding to the currents on the first power wire and the second power wire;

wherein the first coil senses a first magnetic field generated by a current on the first power wire to obtain a first sensing current direction, the second coil senses a second magnetic field generated by a current on the second power wire to obtain a second sensing current direction, wherein the direction of the first magnetic field is opposite to the direction of the second magnetic field, the first sensing current direction is the same as the second sensing current direction.

2. The device for measuring the power consumption according to claim 1, wherein a cosine of a phase difference between the sensing voltage signal and the sensing current signal is the power factor, the real power corresponds to the product of the sensing voltage signal, the sensing current signal and the power factor.

3. The device for measuring the power consumption according to claim 1, wherein the magnetic field detector further comprises a first magnetic element and a second magnetic element, the first coil winds on the first magnetic element, the second coil winds on the second magnetic element.

4. The device for measuring the power consumption according to claim 1, wherein the calculating unit compares the sensing voltage signal and the sensing current signal to a look-up table for calibrating the real power.

5. A method for measuring a power consumption, measuring a real power transmitted by a first power wire and a second power wire of a power line, the method being characterized by:
disposing a first electrode and a second electrode adjacent to the first power wire and the second power wire respectively, disposing a first coil and a second coil adjacent to the first power wire and the second power wire respectively, wherein winding direction of the first coil is contrary to winding direction of the second coil;
obtaining a voltage difference between a voltage level of the first electrode and a voltage level of the second electrode to generate a sensing voltage signal;
coupling the first coil and the second coil in series based on the same sensing current direction for obtaining a sensing current signal corresponding to currents on the first power wire and the second power wire; and
obtaining a power factor according to a phase difference between the sensing voltage signal and the sensing current signal, utilizing a calculating unit to calculate the real power according to the sensing voltage signal, the sensing current signal and the power factor;

wherein in the step of disposing the first coil and the second coil adjacent to the first power wire and the second power wire respectively, the first coil senses a first magnetic field generated by a current on the first power wire to obtain a first sensing current direction, the second coil senses a second magnetic field generated by a current on the second power wire to obtain a second sensing current direction, wherein the direction of the first magnetic field is opposite to the direction of the second magnetic field, the first sensing current direction is the same as the second sensing current direction.

6. The method for measuring the power consumption according to claim 5, wherein in the step of obtaining the real power, a cosine of a phase difference between the sensing voltage signal and the sensing current signal is the power factor, the calculating unit multiplying the sensing voltage signal, the sensing current signal and the power factor to obtain the real power.

7. The method for measuring the power consumption according to claim 5, further comprising:
the calculating unit comparing the sensing voltage signal and the sensing current signal to a look-up table for calibrating the real power.

8. The method for measuring the power consumption according to claim 5, wherein in the step of disposing a first coil and a second coil adjacent to the first power wire and the second power wire respectively, making the first coil wind on a first magnetic element, and making the second coil wind on a second magnetic element.

9. A contactless device for measuring power supply status, measuring a sensing voltage signal and a sensing current signal of a power line at the same time, the power line comprising a first power wire and a second power wire, the contactless device for measuring power supply status being characterized by:
the contactless device for measuring power supply status disposed at a contactless position from the power line with a specific distance, the contactless device for measuring power supply status having an electric field detector and a magnetic field detector;
the electric field detector having a first electrode and a second electrode, the first electrode and the second electrode respectively disposed adjacent to the first power wire and the second power wire at the specific distance, the first electrode and the first power wire creating a first voltage level at the first electrode according to capacitive effect, the second electrode and the second power creating a second voltage level at the second electrode according to capacitive effect, the voltage difference between the first voltage level and the second voltage level being the sensing voltage signal;
wherein the magnetic field detector has a first coil and a second coil, the first coil and the second coil are respectively disposed adjacent to the first power wire and the second power wire at the specific distance, winding direction of the first coil is contrary to winding direction of the second coil, the first coil and the second coil are coupled in series based on the same sensing current direction for obtaining the sensing current signal corresponding to currents on the first power wire and the second power wire;
wherein the first coil senses a first magnetic field generated by a current on the first power wire to obtain a first sensing current direction, the second coil senses a second magnetic field generated by a current on the second power wire to obtain a second sensing current direction, wherein the direction of the first magnetic field is opposite to the direction of the second magnetic field, the first sensing current direction is the same as the second sensing current direction.

10. The contactless device for measuring power supply status according to claim 9, wherein the first coil winds on a first magnetic element, the second coil winds on a second magnetic element.

11. The contactless device for measuring power supply status according to claim 9, wherein the specific distance is the shortest distance between the power line and the contactless device for measuring power supply status, the specific distance is larger than 15 mm.

12. A contactless device for measuring supply current, measuring a current transmitted by a power line, the power line comprising a first power wire and a second power wire, the contactless device for measuring supply current having a detecting unit, the contactless device for measuring supply current being characterized by:

the detecting unit having a magnetic field detector, wherein the magnetic field detector has a first coil and a second coil; the first coil and the second coil are respectively disposed adjacent to the first power wire and the second power wire, winding direction of the first coil is contrary to winding direction of the second coil, the first coil and the second coil are coupled in series based on the same sensing current direction for obtaining a sensing current signal corresponding to currents on the first power wire and the second power wire;

wherein the first coil senses a first magnetic field generated by a current on the first power wire to obtain a first sensing current direction, the second coil senses a second magnetic field generated by a current on the second power wire to obtain a second sensing current direction, wherein the direction of the first magnetic field is opposite to the direction of the second magnetic field, the first sensing current direction is the same as the second sensing current direction.

13. The contactless device for measuring supply current according to claim 12, wherein the first coil winds on a first magnetic element, the second coil winds on a second magnetic element.

* * * * *